United States Patent [19]

Nelson et al.

[11] Patent Number: 4,797,838

[45] Date of Patent: Jan. 10, 1989

[54] PROCEDURE FOR EVALUATING THE METASTABILITY CHARACTERISTICS OF A SYNCHRONIZING DEVICE

[75] Inventors: Hilding E. Nelson, Scandia; Jeffrey O. Brown, St. Paul; Shayne M. Zurn, Blaine, all of Minn.

[73] Assignee: NCR Corporation, Dayton, Ohio

[21] Appl. No.: 120,903

[22] Filed: Nov. 16, 1987

[51] Int. Cl.$^4$ .................... G01D 21/00; G06F 11/00; H03K 11/16

[52] U.S. Cl. .................... 364/551.01; 371/23; 307/443

[58] Field of Search .................. 364/553, 578–580, 364/551, 570, 552, 571, 488, 489; 324/158 SY; 371/20, 23; 307/443, 291, 269

Primary Examiner—Theodore M. Blum
Assistant Examiner—Gregory C. Issing
Attorney, Agent, or Firm—Wilbert Hawk, Jr.; Casimer K. Salys

[57] ABSTRACT

A method for evaluating the metastability characteristics of a synchronizing device having a latching stage, based upon theoretical and/or empirical evaluation of the latching stage circuit. The procedure first defines threshold requirements for an acceptable synchronizing device, including the requirement of a stable response for the latching stage in the region of the metastable operating point, and a further requirement of closed loop gain in excess of one in such operating region. Once the threshold condition are satisfied, mean time between failure to resolve can be conservatively estimated from values of effective gain, effective time delay, permissible time to resolve, rise time on the clock signal, frequency of the clock signal and frequency of the data signal.

4 Claims, 5 Drawing Sheets

REPRESENTATIVE OSCILLATION RESPONSE

VOLTAGE TRANSFER CURVE ( | MIDPOINT GAIN | > 1 )

DATA AND CLOCK WAVEFORMS

TEST SETUP FOR STABILITY TESTING

TEST SET UP FOR GAIN AND GATE DELAY DETERMINATION

TEST SETUP FOR MTBFR EVALUATION

PROCEDURE FOR EVALUATING THE METASTABILITY CHARACTERISTICS OF A SYNCHRONIZING DEVICE

BACKGROUND OF THE INVENTION

The present invention relates to a procedure for testing electronic circuit devices of the type used to synchronize or latch asynchronous signals. More particularly, a procedure is defined the practice of which both identifies devices having fundamental metastability problems and estimates the mean time between failure to resolve (MTBFR) for devices which satisfy a set of threshold conditions.

In the electronic devices, metastability describes the state of a synchronizing device when its output is in neither a logical one nor a logical zero state. It is normally a transient phenomenon, and has been the subject of various publications extending back into the early 1970 time period. For example, concepts of metastability are discussed in the article by authors Chaney et al. entitled "Anomalous Behavior of Synchronizer and Arbiter Circuits" which appeared in the *IEEE Transactions on Computers*, pages 421-422, in April of 1973. The effects of noise on metastability in cross-coupled inverters was the subject of an article by Veendrick entitled "The Behavior of Flip-Flops Used as Synchronizers and Prediction of Their Failure Rate" as appeared in the *IEEE Journal of Solid State Circuits*, Vol. SC-15, No. 2, pages 169-176, in April of 1980, and was also considered in the article authored by Kinniment et al. entitled "Synchronization and Arbitration Circuits in Digital Systems" which appeared in the proceedings of the *Institute of Electronical Engineers (England)*, Vol. 123, pages 961-966, in October of 1976. The susceptibility of integrated circuit synchronizing devices employing Schottky semiconductors to oscillate when subject to metastable conditions is discussed in a publication authored by Goodrich, entitled "Pinpointing Metastable Problems Leads to More Reliable Designs" which appeared in *Communications Systems Equipment Design*, pages 33-35, in February of 1985, and in the paper by Chaney et al. entitled "Beware of the Synchronizer" published in the Proceedings of COMPCON-72, IEEE Computer Society Conference, pages 317-319 in 1972. A circuit arrangement for reducing metastable states and synchronizing elements is described in relatively recent U.S. Pat. No. 4,575,644, where the complementary output of the latching flip-flop is influenced by the injection of a high frequency but low amplitude perturbation signal.

In contemporary designs the metastable state is most often encountered when the set-up and hold times of D-type latches are violated, e.g. by a lack of synchronizism between the latch signal and the data signal.

Notwithstanding the contribution of the prior art to the understanding of metastability as a problem, there remains a need for a practical procedure by which a synchronizing device can be evaluated for susceptibility to metastable conditions, and an extension of such procedure to the actual estimation of the meantime between failure of a fundamentally suitable device to resolve a data signal in the context of its routine use.

SUMMARY OF THE INVENTION

The invention first prescribes threshold conditions for identifying synchronizing devices which have undesirable metastable characteristics. As a further element, the invention defines a relationship for conservatively estimating the mean time between failure to resolve from a combination of device and application parameters, including latching stage gain and speed characteristics, clocking signal parameters, data signal parameters, and the parameters specifying the time interval within which the output state resolution is to be accomplished. Information used in the evaluation procedure may be extracted from simulation data or derived from empirical analysis of the devices.

As a first threshold for acceptability, a synchronizing device latching stage is required to exhibit a stable response while operating in the range of the metastable point. The second aspect of the threshold requirement mandates that the closed loop gain of the device latching stage, while operating in the range of the metastable point, must be greater than one in magnitude. The estimate of meantime between failure to resolve for the device can then be conservatively estimated from a mathematical relationship between the clock frequency driving the device, the frequency of the data signal synchronized by the device, the rise time of the clock signal, the effective closed loop gain of the device latching stage, the effective signal delay time of the device latching stage, and the permissible range of time within which the device output must be resolved.

These and other features of the invention will be described in greater detail in the ensuing development directed to the preferred embodiment.

DESCRIPTION OF THE PREFERRED EMBODIMENT

Figure 1:
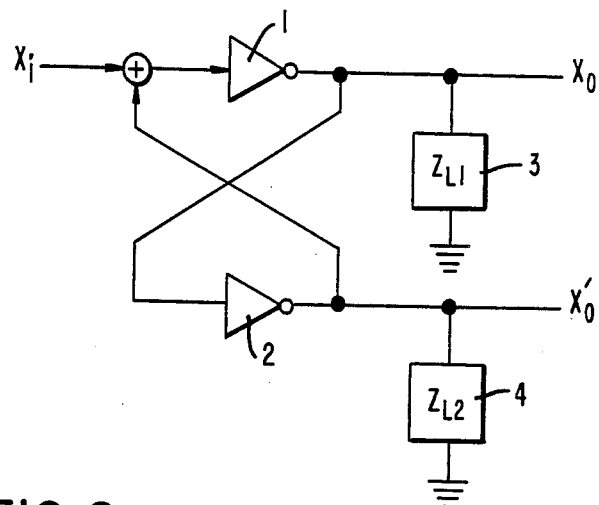
FIG. 1 is a schematic representation of a generic cross-coupled latch.

Attention is now directed to FIG. 1, which schematically depicts the latching stage of the synchronizing device in a functionally equivalent cross-coupled inverter arrangement. In keeping with conventional practices, the circuit in FIG. 1 represents the loads 3 and 4 on amplifiers 1 and 2 by impedances $Z_{L1}$ and $Z_{L2}$. The latching stage of the synchronizing device must exhibit a number of fundamental or threshold requirements as prerequisites to application in a synchronizing device. One such requirement is the presence of a stable response in the device latching stage at the metastable operating point. An appreciation for relevance of this constraint can be gained by considering the oscillation model in FIG. 2, the corresponding oscillation test set-up depicted in FIG. 3, and the recognition that self-regenerating oscillation will not stabilize or resolve in the absence of an external introduction of power.

Figure 2:
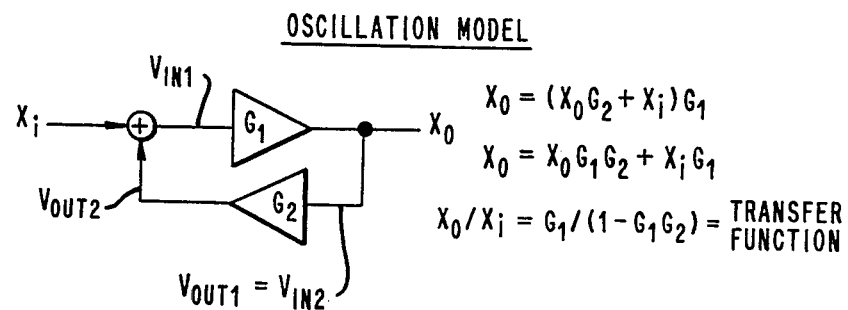
FIG. 2 illustrates a closed loop model suitable for transfer function and oscillation evaluation.

In the context of the closed loop equivalent circuit model shown in FIG. 2, the transfer function of the synchronizing device latch is $G_1/(1-G_1G_2)$. Classic feedback control theory requires, for such transfer function, that the real values of the poles be negative and that the open loop gain be less than one for phase angles which are multiples of 360°.

Figure 3:
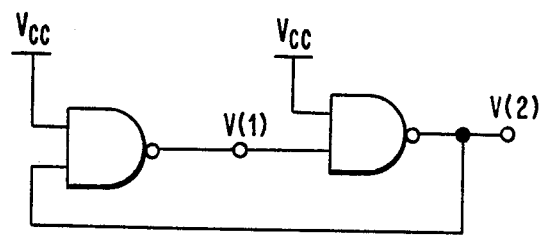
FIG. 3 is a schematic showing a closed loop arrangement of NAND gates for stability and oscillation testing.
Figure 4:
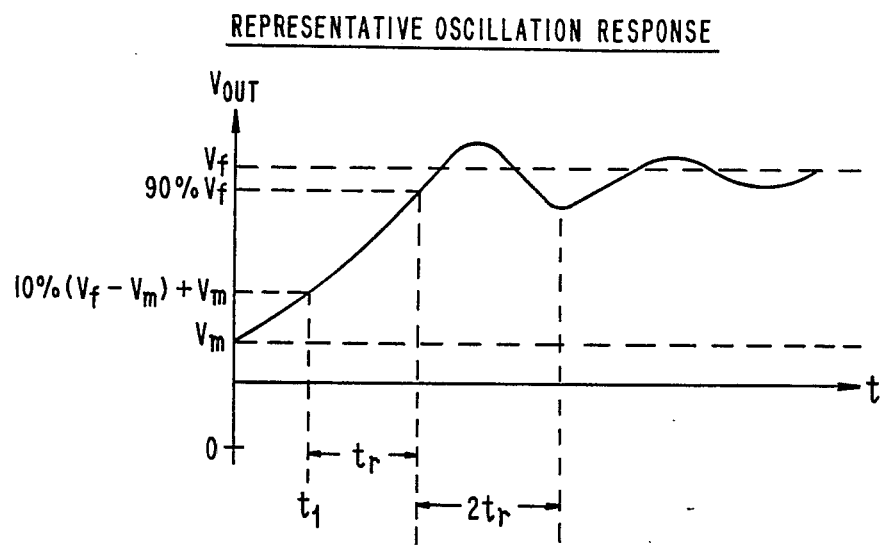
FIG. 4 illustrates a voltage waveform for a representative latching stage response exhibiting a damped oscillation.

In the event the S-plane transfer function pole-zero characteristics or the device Bode plot characteristics are not available, the small signal equivalent circuit depicted in FIG. 2 can be configured as shown in FIG. 3 for computer analysis of the oscillation characteristics. Using computer simulation software such as the commonly available SPICE program, the small signal model in FIG. 3 can be arranged to have the initial conditions for nodes V(1) and V(2) set near the metastable operating point voltage, but with V(1) being slightly less than V(2). In the context of the representative oscillation response to such initial condition, as depicted in FIG. 4, a preferred criterion is that V(2) be within 10% of the final voltage $V_f$ within $3t_r$ after $t_1$. The criterion can obviously be made more stringent to increase the stability safety margins. Furthermore, with the rapid evolution of the simulation tools, it is possible to predict pole-zero, gain margin and phase margin data directly from the simulated latching circuits.

The effects of random noise on the outcome of the metastable synchronizing device depicted in FIG. 1 is presumed to be zero on the average, in keeping with the analyses and conclusions derived in the aforementioned works by Veendrick and Kinniment et al. Though random noise does have a net zero average effect on the outcome state, it still remains as a detracting phenomenon from the perspective of extending the time to resolve, in that noise based oscillations must be suppressed preparatory to resolving.

With a stable response clearly established, the present procedure next requires an evaluation of the synchronizing circuit closed loop gain near the metastable operating point voltage $V_m$. According to the present evaluation procedure, to be acceptable the synchronizing device must have a closed loop gain greater than one in the region around the metastable operating point. A gain of less than or equal to one near such metastable point will cause the cross-coupled latching device to "hang up" at the metastable voltage until displaced from such point by noise or other pertubation signal.

Figure 5:
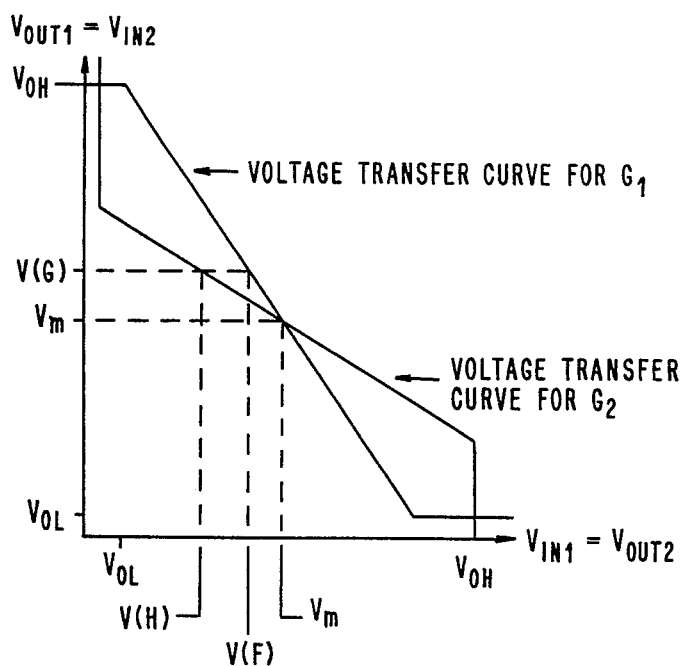
FIG. 5 illustrates the voltage gain curves for a cross coupled latching stage of a synchronizing device.

The importance of a high closed loop gain may be more fully appreciated upon considering the voltage transfer curves in FIG. 5 for the closed loop amplification elements schematically identified as $G_1$ and $G_2$ in FIG. 2. In the context of a closed loop where the input and output voltages of amplifiers $G_1$ and $G_2$ are interconnected, a divergence of the $G_1$ output voltage from the metastable level $V_m$ to a slightly different level V(F) produces, after one gate delay through $G_1$, an output voltage $V_{OUT1}$ of a value V(G), which after one additional gate delay appears as an output from $G_2$ as a voltage V(H). Repeating this sequence of operations, using the transfer curve plotted in FIG. 5, illustrates that the output voltage from $G_1$, namely $V_{OUT1}$, stabilizes to $V_{OH}$ while the output from amplifier $G_2$, namely $V_{OUT2}$, stabilizes to $V_{OL}$ within a total of approximately 5 inverter delays. Upon recognizing that the slopes of the transfer curves are representations of the gains, it becomes apparent that the higher the gain the fewer the number of gate delays that are necessary to reach the final and stable output states. The corollary is equally apparent, wherein a synchronizing device having closed loop gain of absolute value less than one results in signals migrating to the metastable state. This analysis confirms that an effective synchronizing device must exhibit among its characteristics a closed loop gain greater than one in the region of the metastable operation point.

A synchronizing device which satisifies the stability and gain criteria set forth hereinbefore exhibits the threshold requirements for prediction of meantime between failure to resolve (MTBFR). The estimation of MTBFR is funamentally based upon the premise that there exists a direct relationship between the amount of time allowed for the device to resolve from metastable operation and the frequency of failures to resolve, to the effect of the failure rate decreases as the period of time to resolve increases. The application of this concept to the estimation of MTBFR requires, in addition to the prerequisites of stability and gain at the metastable point, an evaluation of the latching stage of cross-coupled inverters for effective gain (A) and effective delay ($T_p$).

Figure 6:
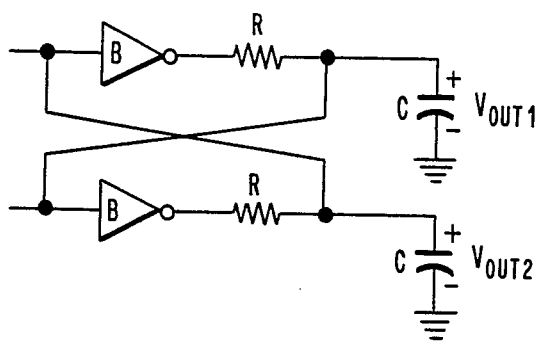
FIG. 6 schematically represents a equivalent circuit for analyzing a cross coupled latch composed of amplifiers.

To determine the effective gain A and stage delay $T_p$, consider the equivalent circuit depicted in FIG. 6. Linear, small signal analysis at the metastable operating point where $V_m = V_{IN} = V_{OUT}$, and the assumption that the stage behavior can be modeled by a single dominant pole, leads to the following solution for large values of time t.

$$V_{OUT1}(t) = [(V_{OUT1}(0) - V_{OUT2}(0))/2]e^{((B-1)/RC)t}$$

Furthermore, since $V_{OUT2}(0) = -V_{OUT1}(0)$, the equation may be simplified to:

$$V_{OUT1}(t) = V_{OUT1}(0)e^{((B-1/RC)t}$$

Following procedures described in the aforementioned teachings, the effective time dalay and gain are derived to be:

$$T_p = RC(45°/360°) = RC/8$$

$$A = \exp[(B-1)/8]$$

In the event the cross-coupled inverters do not operated in a linear region when the input and output voltages are equal, or the AND gates of the inverters can not be reasonably characterized by a single dominant pole, the estimated value of A will be somewhat too great and the value of $T_p$ will be somewhat too small in that the estimation of $T_p$ is based upon the delay at the 3db point.

Relatively precise quantification of MTBFR requires detailed knowledge of the electronic characteristics exhibited by the latching section, for example, as may be extracted from SPICE simulations of the detailed design. On the basis of such information, the effective gain A and the effective delay $T_p$ may be determined with relative accuracy. However, when precise parameter information is not available, the alternative to solving a transcendental equation for an analytical solution is reversion to empirical analyses. With recognition that the empirical approach will frequently be pursued to estimate the MTBFR characteristics, attention is redirected to the voltage transfer curve plotted in FIG. 5 as supplemented by the waveform representations in FIG. 7. In the absence of noise, and with a perfect alignment of the voltage $V_{IN1}$ and $V_{OUT2}$ to $V_m$, the synchronizing device remains metastable indefinitely. If, however, the input voltage $V_{IN1}$ begins at a voltage other than $V_m$, for example, using the identifier E for an absolute value difference between $V_m$ and V(F), an effective gain A, and effective delay $T_p$ at the 3db frequency, then EA*A represents the voltage difference amplified from the instant the data signal is latched until the period $2T_p$ later.

If $T_{rc}$ is the time resolve, namely the time interval between the instant data is latched and the instant the latched output is actually sampled by the next stage, then $T_{rc}/2T_p$ is the number of times the initial voltage difference E can be amplified by the cross-coupled inverters before it has to be valid. Therefore, $EA^{(2Trc/2Tp)}$ is the total amount that the voltage difference can be amplified in a given period $T_{rc}$. For the device to have a valid output voltage at the time $T_{rc}$, $EA^{(Trc/Tp)}$ must be greater than or equal to $V_s/2$, or E must be greater than or equal to $V_s/2A^{(Trc/Tp)}$ where $V_s$ is equal to $V_{OH}$ minus $V_{OL}$ and $V_m$ is at the midpoint with a value of $V_s/2$.

Figure 7:
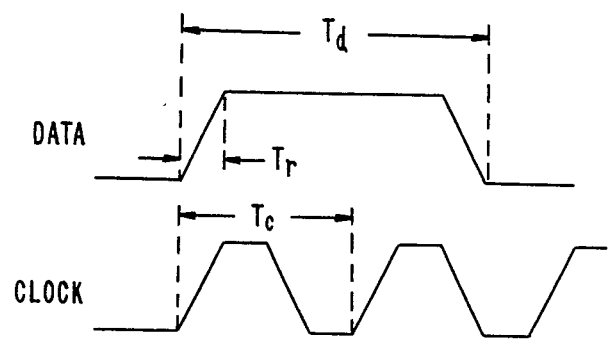
FIG. 7 illustrates the waveforms of representative data and clock signals.

To find the probability of having $E < V_s/2A^{(Trc/Tp)}$, which will cause the device to fail, consider the relationships shown by waveform in FIG. 7. The data signal transition time, $T_r$ is considered the window of vulnerability. During this interval, a data signal latched as $V_{IN1}$ by a clock signal is not specified as either a valid logic high or logic low data state. Furthermore, during the window of vulnerability all voltage values between a valid logic high and valid logic low have an equal probability of occurring at the $V_{IN1}(0)$, the voltage at the initial instant. From the waveforms shown, the statistical likelihood of landing within the time interval $T_r$ is equal $T_r/T_d$, where $T_d$ is a period of time during wich the data signal remains in either a logical high or logical low state. The number of times the data is sampled over the expanse of the full data period $T_d$ is based upon the duration $T_c$ of the clock.

The total probability of a clock cycle overlapping the interval $T_r$ during one time interval $T_d$ is equal to $(T_r/T_d)*(T_d/T_c)=T_r/T_c$. The further probability of $V_{in1}(0)$ landing within the small voltage interval E near the metastable point $V_m$ while within the range $T_r$ is equal to $2E/V_s$ for the total of both sides of $V_m$.

The threshold value for E necessary for the device to have a valid output within $T_{rc}$ is $E=V_s/2A^{(Trc/Tp)}$. The probablity of the data signal landing within the range of E during $T_r$ is equal to $2V_s/V_s2A^{(Trc/Tp)}$, which when simplified equals $A^{-(Trc/Tp)}$. The further probability of $V_{IN1}(0)$ landing within E during one time interval $T_d$ is equal to the probability of the data signal landing within $T_r$ times the probability of the data signal landing within the range of E while the signal is within the time interval $T_r$, namely $(T_r/T_c)*(1/A^{(Trc/Tp)})$. The number of times a second that the signal $V_{In1}(0)$ is of a magnitude within the range of the voltage E, and thereby subject to failure, is equal to 1/MTBFR, and is numerically equal to the frequency of the data times the probability of having a value within the range of E within one $T_d$ time interval. Substituting the values and solving for MTBFR results in a quantitative relationship for MTBFR of $A^{(Trc/Tp)}/F_dT_rF_c$, where A is the effective gain, $T_{rc}$ is the device resolve time, $T_p$ is the delay through the inverter, $T_r$ is the clock rise time, $F_d$ is the data frequency and $F_c$ is the clock frequency.

The effectiveness of the synchronizing device evaluation procedure described hereinbefore was empirically confirmed through a variety of tests. One group of tests evaluated the commercially available 7400 series devices with cross-coupled NAND gates. The test devices routinely exhibited empirical MTBFR values of similar distribution, but greater magnitude than predicted by the numerical analysis described above. See the sample plots in FIG. 11. Therefore, though conservative, the calculated values for MTBFR do represent meaningful measures of the synchronizing device's MTBFR performance.

Figure 8:
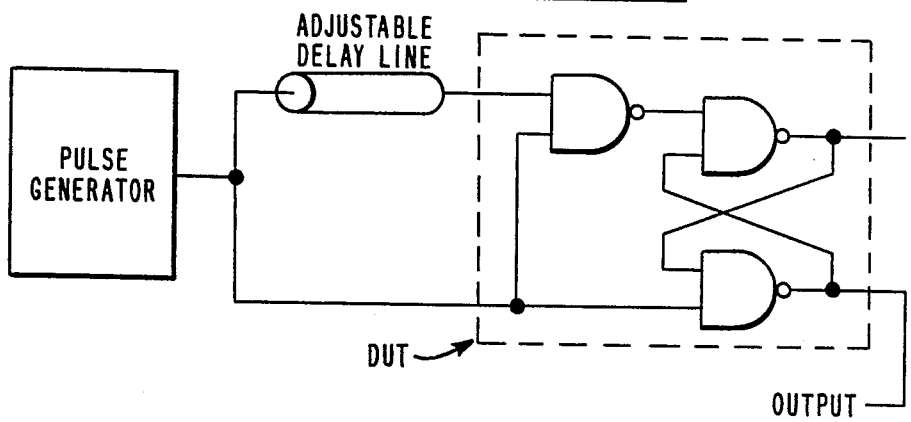
FIG. 8 illustrates a test configuration for evaluating stability.

The stability requirements of the present procedure may be confirmed in a test configuration of the type depicted in FIG. 8 For sample 7400 series integrated circuit devices, the test circuit confirmed open looped stability by damping the induced oscillations within approximately 30 nanoseconds.

Figure 9:
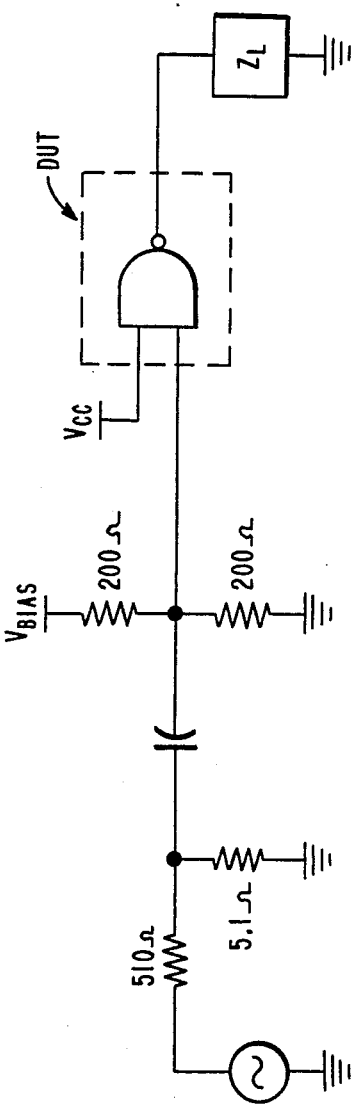
FIG. 9 illustrates a test configuration for determining inverter gain and delay.

Empirical evaluations of the effective gain A and effective gate delay $T_p$ may be performed using the test configuration shown in FIG. 9. For the illustration, a single NAND gate (DUT) is first biased to make the input and output voltages substantially equal. A low frequency AC signal is then superimposed and the DC gain B of the stage is measured. The effective gain A is then determined from the value of DC gain B. Thereafter, the frequency of the AC signal is increased until the DC gain B decreases to its former value divided by the square root of two. The delay of the stage at this frequency is used to prescribe the value of $T_p$. Adjustments may be made as necessary to take in account the presence of the multiple gates or inverter stage in the actual synchronizing device.

Figure 10:
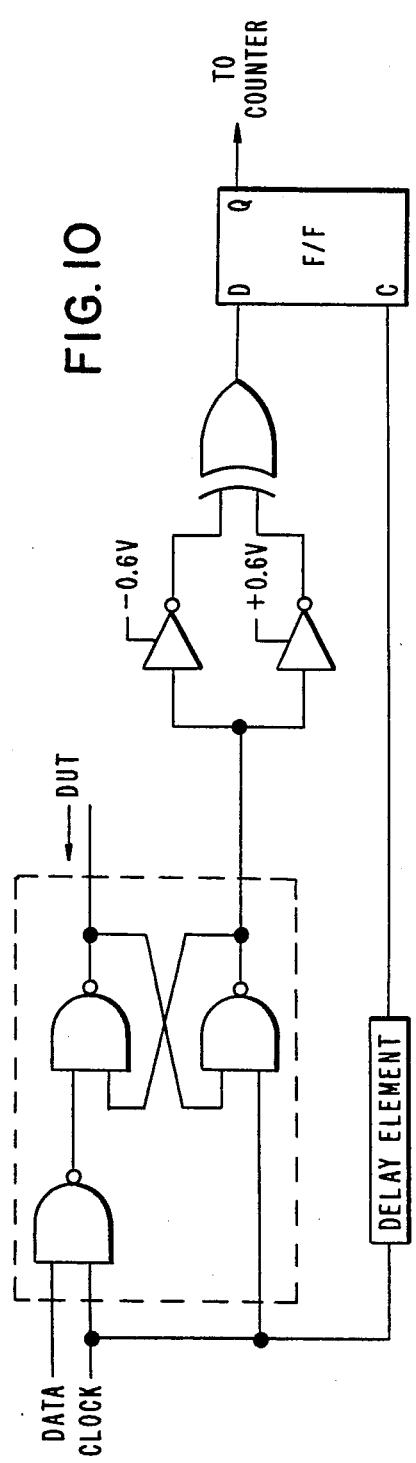
FIG. 10 illustrates a test configuration for evaluating MTBFR.
Figure 11:
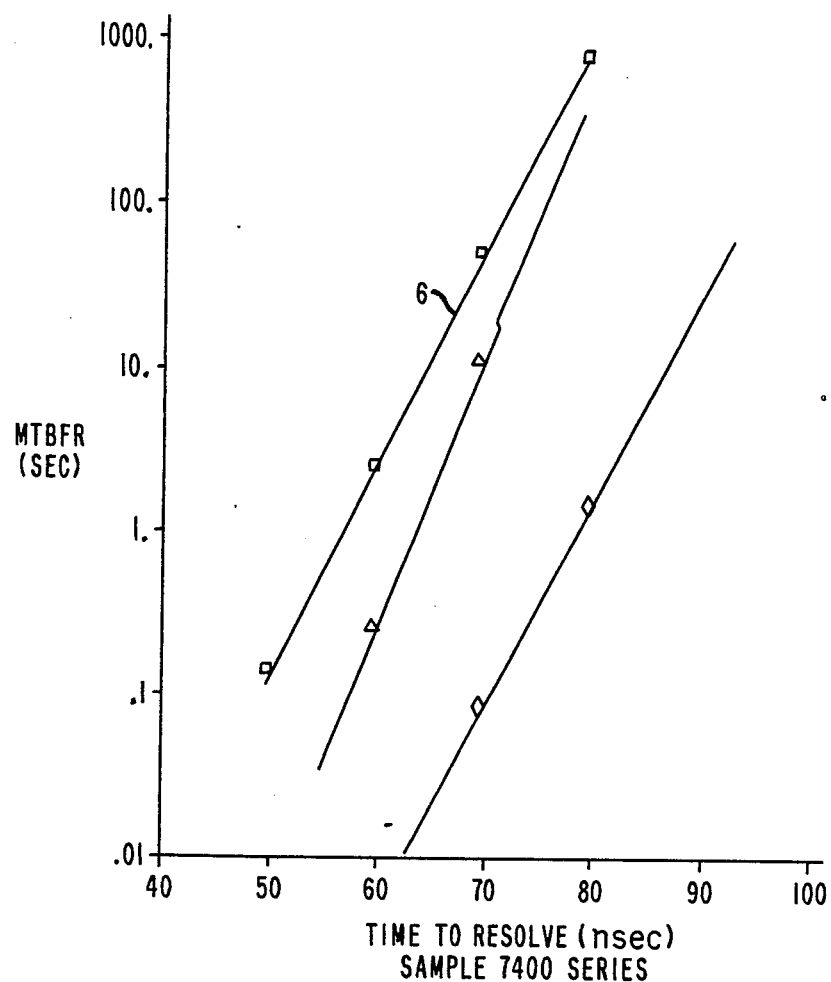
FIG. 11 shows comparisons of empirically derived and calculated MTBFR values for a sample 7400 series integrated circuit device.

The MTBFR characteristics of a synchronizing device can be exerimentally derived using a test circuit of the form depicted in FIG. 10. The DUT is considered to have failed if the output is unresolved upon the lapse of the specified time limit. Plot 6 in FIG. 11 is a representative result. Obviously, one must take into account time delays associated with inverter devices 7 and 8, as well as XOR device 9, in quantifying the time to resolve.

In conclusion, a synchronizing device can be evaluated for susceptibility to metastable characteristics and associated failures to resolve through the application of a sequence of threshold constraints. One constraint requires that the device latching stage exhibit a stable response when operating near the metastable point, including well defined damped poles and reasonable phase margin. As a second threshold constraint, the close loop gain of the device latching stage must be greater than one in the region around the metastable operating point. Given the satisfaction of such threshold conditions, the mean time between failure to resolve can be quantified by empirical analysis of the device, or preferably by theoretical estimation. The latter approach requires an evaluation of the effective gain and effective delay for the latching stage of the device. A conservative estimate of the time between failure to resolve can be calculated using the values for the effective gain, the effective inverter delay, the permissible device resolve time, the clock rise time, the data frequency and the clock frequency.

It will be understood by those skilled in the art that the enclosed embodiment is merely exemplary of the various elements and procedures emcompassed by the invention, and as such may be replaced by equivalents without departing from the invention hereof, which will now be defined by the appended claims.

We claim:

1. A method for evaluating the metastability characteristics of a synchronizing device having a latching stage, comprising the steps of:
    verifying a stable response of the latching stage in the region of the metastable operating point;
    verifying that the closed loop gain of the latching stage is greater than one in the region of the metastable operating point; and
    estimating of the meantime between failure to resolve from a combination of values relating to the effective gain (A) of the latching stage, the effective time delay (TP) through the latching stage, the time allowed for the latching stage to resolve (Trc), the rise time of a clock signal (Tr), the frequency of the clock signal (Fc) and the frequency of the data signal (Fd).

2. The method recited in claim 1, including the further steps of:
    estimating the value of the effective gain of the latching stage from a linear model of fixed gain in the region of the metastable operating point; and
    estimating the value of the effective time delay through the latching stage from a linear model exhibiting a dominant pole.

3. The method recited in claim 1, wherein the estimate of mean time between failure to resolve (MTBFR) is defined by the relationship:

$$MTBFR = A^{(Trc/Tp)}/F_d F_c T_r$$

4. The method recited in claim 2, wherein the estimate of meantime between failure to resolve (MTBFR) is defined by the relationship:

$$MTBFR = A^{(Trc/Tp)}/F_d F_c T_r$$

* * * * *